(12) United States Patent
Krajec et al.

(10) Patent No.: US 6,298,738 B1
(45) Date of Patent: Oct. 9, 2001

(54) REMOVABLE FIXTURE ADAPTER WITH RF CONNECTIONS

(75) Inventors: Russell Steven Krajec, Berthoud; Michael John Oreskey, Loveland, both of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/585,205

(22) Filed: Jun. 1, 2000

Related U.S. Application Data

(62) Division of application No. 09/026,083, filed on Feb. 19, 1998, now Pat. No. 6,070,478.

(51) Int. Cl.[7] .................................................. H04B 17/00
(52) U.S. Cl. .............................................................. 73/865.9
(58) Field of Search ............................... 73/865.6, 865.8, 73/865.9; 200/61.61; 381/58; 455/226.1, 226.4, 67.1, 67.2, 67.4

(56) References Cited

U.S. PATENT DOCUMENTS

| 2,530,233 | * | 11/1950 | Dockray et al. . | |
|---|---|---|---|---|
| 3,569,677 | * | 3/1971 | Bray et al. . | |
| 5,392,631 | * | 2/1995 | Elwell | 73/865.9 |
| 5,625,891 | * | 4/1997 | Tucker et al. . | |
| 5,675,098 | * | 10/1997 | Hobbs | 73/865.6 |

* cited by examiner

*Primary Examiner*—Robert Raevis

(57) ABSTRACT

The inventive fixture adapter has installed RF connectors which are connected to the fixture during the installation of the adapter in the fixture. Thus, wear on the RF connectors from opening and closing the drawer mechanism of the fixture is eliminated. The adapter is removably connected to the drawer mechanism of the fixture, and thus can quickly and reliably be changed for a different adapter. All of the customization required for a particular device can be confined to the adapter, and thus the rest of the fixture can be made generic.

5 Claims, 3 Drawing Sheets

REMOVABLE FIXTURE ADAPTER WITH RF CONNECTIONS

RELATED APPLICATIONS

The present application is a divisional of Ser. No. 09/026,083, filed on Feb. 19, 1998, commonly assigned U.S. Pat. No. 6,070,478, issued Jun. 6, 2000, entitled "REMOVABLE FIXTURE ADAPTOR WITH RF CONNECTIONS," and is related to commonly assigned U.S. Pat. No. 6,097,334, issued Aug. 1, 2000, entitled "QUICKLY REMOVABLE RF SEALED COVER FOR TEST FIXTURE," U.S. Pat. No. 6,037,788, issued Mar. 14, 2000, entitled "DOCKING STATION FOR AUTOMATED COMMUNICATIONS TEST FIXTURE," U.S. Pat. No. 6,047,599, issued Apr. 11, 2000, entitled "DRAWER STYLE FIXTURE WITH INTEGRAL RF DOOR," and U.S. Pat. No. 6,067,866, issued May 30, 2000, entitled "REMOVABLE FIXTURE ADAPTER WITH PNEUMATIC ACTUATORS," the disclosures of which are hereby incorporated herein by reference.

TECHNICAL FIELD

This application relates in general to automatic testing machines, and in specific to an adapter for a test fixture of an automatic testing machine which includes RF connections on the adapter.

BACKGROUND OF THE INVENTION

An automatic testing machine (ATM) operates in a production environment to rapidly and accurately test the operation and performance of various types of devices under test (DUT), including RF communication devices. The DUTs could be a finished product or a component of a larger system.

The ATM is programmed to perform various tests on the DUT automatically. For example, RF signals are transmitted to a finished cellular telephone DUT to determine if the telephone activates. Other tests could include environmental tests, such as temperature or vibration tests.

Depending upon the nature and number of the tests being performed, the testing may last from a couple of milliseconds to several minutes. The information from the testing is compared with expected test results. If there is some defect so that the DUT falls below specifications, the ATM will designate the DUT as failed, either by marking the DUT, placing the DUT in a failure area, or indicating the failure to an operator.

The ATM is then loaded with the next DUT, either manually or automatically, and the testing procedure is repeated for this DUT. This test information can be used to evaluate the fabrication process for possible changes, as well as to perform failure analysis on individual failed devices.

Typically, each ATM is designed to perform a specific class of tests on the DUT, and are not able to perform other classes of tests. For example, a vibration ATM may not be able to perform electrical signal tests. However, different types of DUTs may require the same tests to be performed. For example, all types of microcomputer chips are tested for electronic performance characteristics, but different chips will have different locations for power, inputs and outputs. ATMs are made flexible by the use of test fixtures. The test fixture provides an interface between the device under test DUT and the ATM. Thus, a single ATM can perform tests on different types of devices when connected via different fixtures.

Fixtures typically have a drawer mechanism, which opens up and allows the DUT to be placed inside the fixture. The fixture may have an RF cable that fixedly mounted within the fixture, and has a length of cable which is connected to the drawer mechanism. The cable terminates at a connector which is pneumatically engaged on the telephone. Some fixtures have RF probe connector mounted inside the fixture which makes contact with an antenna element on the DUT. Thus, contact is not made until the drawer is closed. Thus, RF connections, pneumatic actuators, and their air supplies, are hardwired or constructed directly onto the drawer mechanism. The hardwired aspects makes fixtures extremely difficult to reconfigure, because all the of the fixture elements are integrally built into the fixture.

Moreover, fixtures tend to be large and bulky. Also, they have numerous connections to the ATM for the required resources to allow testing, e.g. power, electronic signals, RF signals, and pneumatic air pressure. Thus changing fixtures is time consuming, as each individual connection to the ATM must be separated, the current fixture removed, and then the new fixture installed. During the replacement process, the production line is shut down, which results in lost production time. If the fixture needs to be repaired, then this process must be undertaken, and the lost production time is unavoidable. However, if the fixture is to be changed merely to accommodate a different DUT, then the lost production time can be mitigated by using an adapter. An adapter is a DUT holder that is coupled to the fixture on the drawer mechanism. The adapter is customized to hold the specific type of DUT. If a different DUT needs to be tested then the adapter in the fixture is swapped for the proper adapter.

However, the adapter does not have any continuous or semi-permanent RF connections, as RF connection is only made when the drawer mechanism is closed. The lack of continuous connection by itself is not a problem, since RF testing cannot begin until the RF sealed drawer is closed. The problem is the wear on the connectors from many cycles of the drawer being opened and closed. Typically, one end of a connector is located at the back of the adapter, and the other end of the connector is located inside of the fixture mount, thus, when the drawer is closed, the connection would be made. The RF connection degrades based on the number of cycles, and the degradation is very significant. One form of degradation is where the plating on the mating parts wears from continual cycles of making and breaking contact. Another form occurs where the connectors have a soft plastic core used to form a dielectric layer between the two conductors of the coaxial cable. The plastic core would crack or degrade from the flexings caused by cycles of making and breaking contact. Consequently, the connectors do not last very long, and significant production downtime is incurred for replacing the connectors.

Therefore, there is a need in the art for a system and method that allows for the rapid and reliable conversion of an ATM to test a different DUT, and at the same time reduce the wear on RF connections from opening and closing the drawer mechanism of the fixture in a production environment.

SUMMARY OF THE INVENTION

These and other objects, features and technical advantages are achieved by a system and method that uses a fixture adapter that has RF connectors installed on the adapter. Connections from the fixtures to the RF connectors from the fixture are made during installation of the adapter in the fixture.

The adapter is removable from the drawer style fixture, and thus can quickly and reliably be changed for a different adapter for another DUT or to perform maintenance on the current adapter. The adapter allows all of the customization required for a certain product or DUT to be confined to one removable piece which can be quickly changed for a different DUT. This allows the rest of the fixture to be generic. Moreover, the adapter can have more custom features than a prior art fixture could have, since prior art fixtures were built to be more generic than the inventive adapter.

Since the RF connections are made to the adapter at the time of the installation of the adaptor, no wear occurs on the RF connectors from cycles of opening and closing the fixture drawer. The only time the connection is made is during installation of the adapter, and the only time connection is broken is during removal of the adapter.

A technical advantage of the present invention is reduction in downtime and errors caused by changing fixtures to test a different device.

Another technical advantage of the present invention is the reduction in cycle wear on RF connectors.

A further technical advantage of the present invention is that all customization required for a particular DUT is located on the adapter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
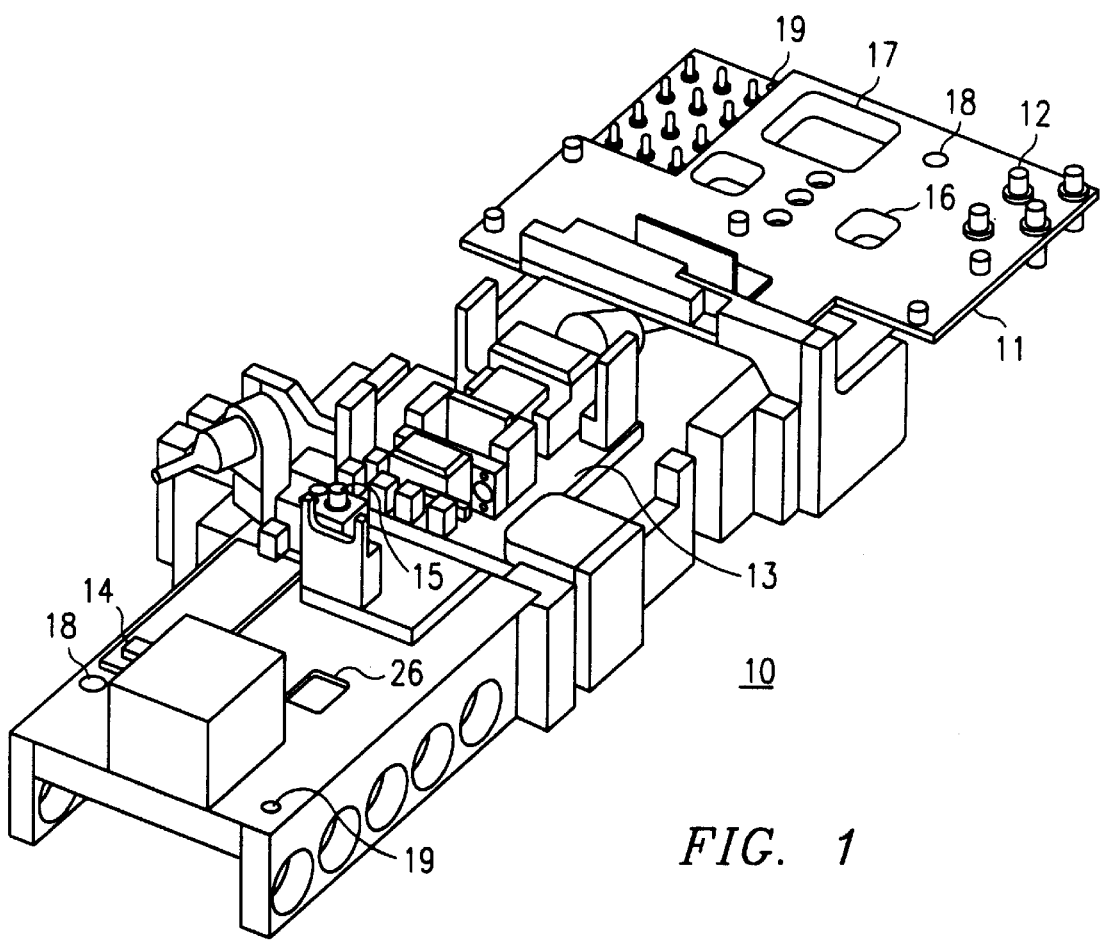
FIG. 1 depicts the inventive adapter mechanism.

FIG. 1 depicts the inventive adapter mechanism 10. Adapter 10 includes base plate 11 upon which other elements are secured. RF connectors 12 are located in the rear of the adapter 10. Each of connectors 12 comprises double male connectors, one on top of plate 11 and one underneath plate 11. The connections underneath couple via quick disconnects to female connectors located on fixture 20 of FIG. 2, and the connections on top couple with RF emission points or contact points. Alternatively, female connectors can be located under plate 11 which couple to male connectors located on fixture 20. With either arrangement, the connection between adapter 10 and fixture 20 occurs when the adapter is installed. In other words, as the adapted is pushed into the fixture, connectors 12 couple with complementary connectors 22. The RF lines (not shown for reasons of simplicity) from the connectors 12 are routed down through hole 16 to the various RF contact points on adapter 10. Thus, the lines do not interfere with the loading and unloading process of the DUTs and the operations of the actuators during testing.

Adapter 10 has several RF contact points. The number and location of the RF connecters 12 and contact points is by way of example only, as the precise number and placement depends upon the testing requirements of the particular DUT and ATM. On the adapter depicted in FIG. 1, there are two RF contact points. The first point 14 is to an over-the-air antenna, which transmits the RF signal through the air. The second point 15 is a direct connection made with the DUT, in this case, a cellular telephone. Note that connection 15 is vertically moved by a pneumatically actuated slide. Typically, direct RF connections to the DUT are more accurate than the over-the-air RF connections. The RF cables from connections 12, which pass though hole 16 to travel beneath plate 11 would emerge through hole 26 and attach at connection points 14 and 15. Connection wear is prevented because the connection to connectors 12 is not made and broken with every cycle. However, some wear will occur at connection point 15. However, the prior art would also incur corresponding wear at a similar location, in addition to the connection wear from opening and closing the drawer.

Figure 3:
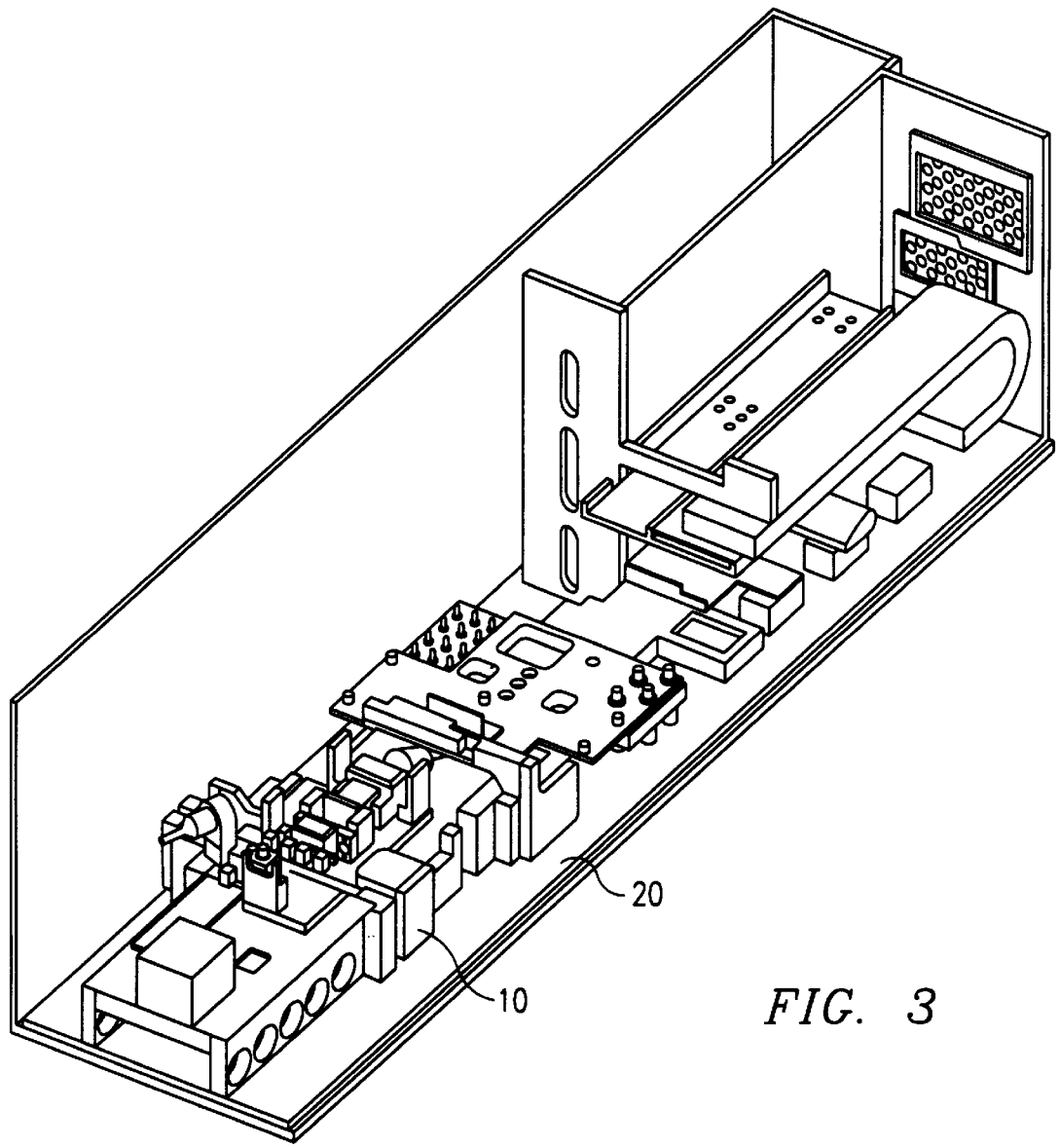
FIG. 3 depicts the adapter of FIG. 1 in the drawer fixture of FIG. 2.

Adapter 10 is coupled to fixture 20 via holes 18. Holes 18 are hardened steel bushing, each bushing receives an alignment pin 23 located on drawer 21 of fixture 20. Adapter 10 also includes holes 19 into which 1/4 turn fasteners are placed which secure adapter 10 to fixture drawer 21. Other types of fasteners could be used. Thus, to change adapters, the fasteners are removed and the adapter is pulled out. This simultaneously separates connectors 12 from receivers 22. The replacement adapter is then aligned in the drawer, via the alignment pins 23 and bushing 18, and installed. This simultaneously connects the connectors 12 and the receivers 22. The fasteners are then installed to secure the adapter. FIG. 3 depicts adapter 10 connected to fixture 20.

Figure 2:
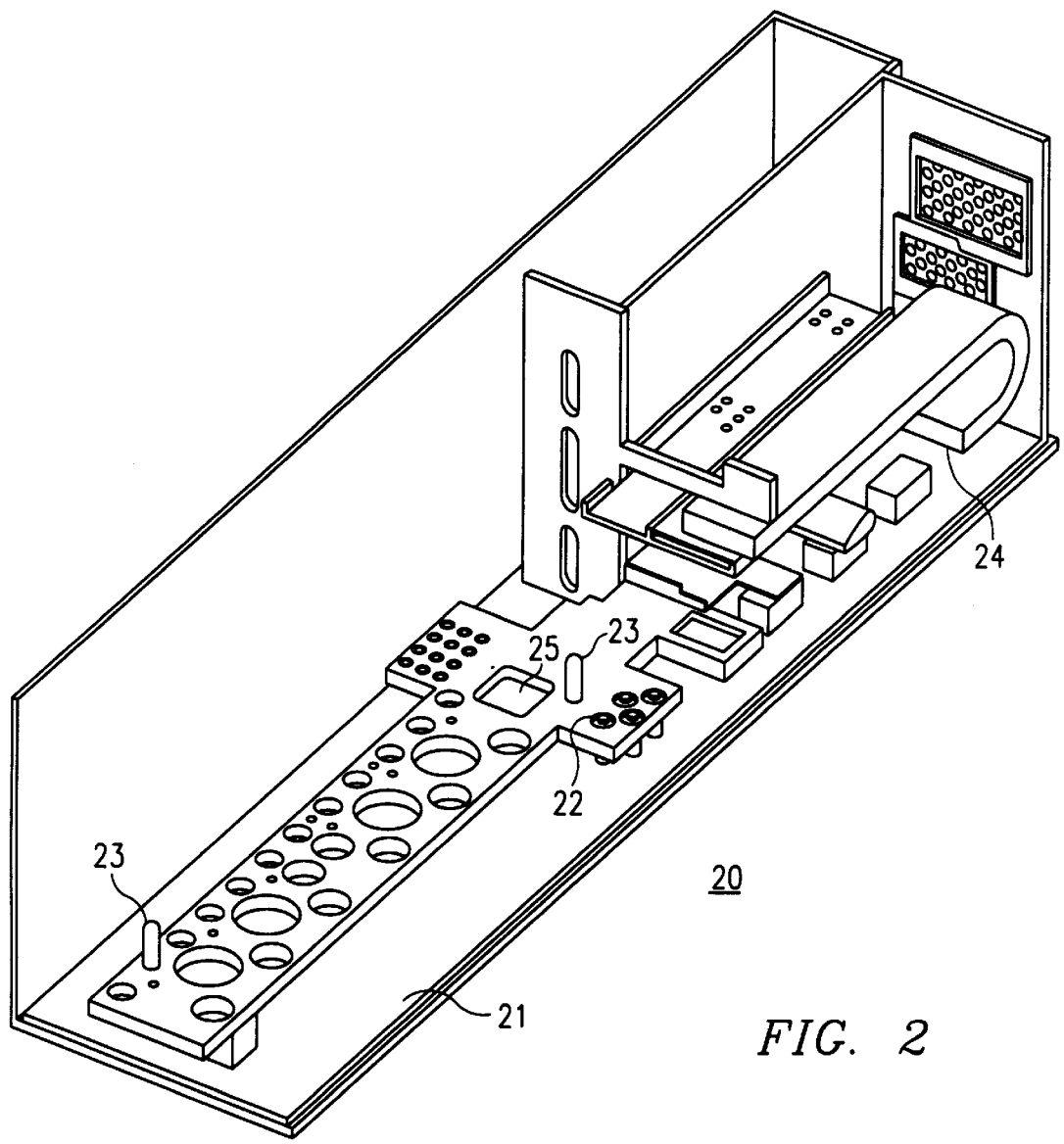
FIG. 2 depicts a drawer type fixture for an automatic testing machine.

FIG. 2 depicts fixture 20 with drawer 21. Fixture 20 includes RF receivers 22. RF lines are connected between receivers 22 and the fixture 20. Fixture 20 also includes alignment pins 23 which are used to align adapter 10 during loading of the adapter. Fixture 20 uses cable router 24 to bundle the RF lines which lead to receivers 22.

Adapter 10 has portion 17 used for electrical signal connectors (not shown). These connectors are spring loaded pins that engage straight down onto a printed circuit board 25 having an array of test pads, which would be located on fixture 20. The electrical connection would be made (or broken) simultaneously with the installation (or removal) of the adapter. The circuit board would provide data signals, control signals, and other types of electrical signals necessary for the testing of the DUT. The adapter has nest area 13 to secure the DUT (not shown). Although not shown in the adapter of FIG. 1, pneumatic actuators can be used in nest area 13 to capture and hold the DUT. The adaptor also includes pneumatically actuated slides, which move both vertically and horizontally to engage the DUT for testing. The adapter also may hold various transducers (not shown) to communicate with or measure the DUT, including but not limited to infrared communications, vibrations sensors, acoustic microphones, DUT presence sensors, color detectors, RF couplers, etc.

During operation of the ATM, a DUT is loaded into adapter 10 of fixture 20. Completion of loading is communicated to the ATM via the loading robot. Once the drawer is closed, testing begins, typically with calibration of the DUT and sensors. Other testing such as operational testing or RF testing is performed with the drawer closed. Once testing is completed the drawer is opened and the next device is tested.

Note that the testing of the DUT may require electrical signals and/or chemicals, in addition or instead of RF signals. Thus, the connectors and lines, as described above with regards to RF, would allow the passage of either electricity or chemicals from the fixture to the there required use or testing points through the adapter. Chemicals may require a return line for unused chemicals or chemical bi-products from testing. Electrical signals would either require a return line or having the adapter grounded to the fixture, to allow the flow of electrical current. Return lines would follow the same path through the adapter as the lines bringing resource. Note that various combinations of the testing resources may be required to perform tests on the DUT held on the adapter.

Although the present invention and its advantages have been described in detail, it should be understood that various changes, substitutions and alterations can be made herein without departing from the spirit and scope of the invention as defined by the appended claims.

What is claimed is:

1. A method for changing a first adapter that holds a device to be tested in an automatic testing machine for a second adapter, wherein the first adapter is coupled to a drawer mechanism of a fixture of the machine, the method comprising the steps of:

removing a fastener which is connected to the drawer through a fastener hole in the first adapter;

removing the first adapter and simultaneously disconnecting at least one RF connection with the drawer;

aligning the second adapter in a predetermined position with respect to the drawer by passing alignment pins located on the drawer through corresponding bushing holes on the second adapter;

installing the second adapter and simultaneously connecting at least one RF connection to the drawer; and inserting a fastener through a fastener hole in the second adapter and connecting the second adapter to the drawer; and wherein the at least one RF connection supplies an RF signal to at least one RF connection point which is coupled to the device.

2. The method of claim 1, wherein:

the second adapter includes a hole which allows the one line to pass through the second adapter and run beneath the second adapter to the one RF connection point.

3. The method of claim 1, wherein:

the one RF connection point is an antenna which radiatively transmits the RF signal to the device.

4. The method of claim 1, wherein:

the one RF connection point is a contact which directly transmits the RF signal to the device.

5. The method of claim 1, wherein:

the one connection is continuously coupled to the drawer such that connection is maintained when the drawer mechanism is in open and closed positions.

* * * * *